United States Patent
Agrawal et al.

(10) Patent No.: US 11,601,130 B2
(45) Date of Patent: Mar. 7, 2023

(54) INITIALIZATION CIRCUIT OF DELAY LOCKED LOOP

(71) Applicant: NXP B.V., Eindhoven (NL)

(72) Inventors: Gaurav Agrawal, Aligarh (IN); Deependra Kumar Jain, Noida (IN); Krishna Thakur, GautamBudh Nagar (IN)

(73) Assignee: NXP B.V., Eindhoven (NL)

( * ) Notice: Subject to any disclaimer, the term of this patent is extended or adjusted under 35 U.S.C. 154(b) by 15 days.

(21) Appl. No.: 17/304,628

(22) Filed: Jun. 23, 2021

(65) Prior Publication Data

US 2022/0416796 A1    Dec. 29, 2022

(51) Int. Cl.
*H03L 7/10* (2006.01)
*H03L 7/081* (2006.01)
*H03L 7/089* (2006.01)

(52) U.S. Cl.
CPC .............. *H03L 7/10* (2013.01); *H03L 7/0816* (2013.01); *H03L 7/0891* (2013.01)

(58) Field of Classification Search
CPC ..... H03L 7/081; H03L 7/0812; H03L 7/0814; H03L 7/0816; H03L 7/0818; H03L 7/085; H03L 7/089; H03L 7/0891; H03L 7/0893; H03L 7/0895; H03L 7/0896; H03L 7/0898; H03L 7/10

See application file for complete search history.

(56) References Cited

U.S. PATENT DOCUMENTS

| | | | | |
|---|---|---|---|---|
| 7,190,201 | B2 * | 3/2007 | Haerle | H03L 7/0891 327/158 |
| 7,486,147 | B2 * | 2/2009 | Khorram | H03L 7/0891 331/34 |
| 8,503,598 | B2 | 8/2013 | Mai | |
| 8,933,736 | B2 * | 1/2015 | Kim | H03L 7/1072 327/158 |
| 10,263,627 | B1 | 4/2019 | Jain et al. | |
| 2007/0024335 | A1 | 2/2007 | Sato | |
| 2014/0312945 | A1 | 10/2014 | Ippili et al. | |
| 2014/0347107 | A1 | 11/2014 | Kim | |

FOREIGN PATENT DOCUMENTS

| | | |
|---|---|---|
| EP | 1819051 A2 | 8/2007 |
| EP | 1819051 A3 | 8/2007 |

* cited by examiner

*Primary Examiner* — Diana J. Cheng

(57) ABSTRACT

An initialization circuit of a delay locked loop (DLL) includes a sense circuit and a control circuit. The sense circuit receives an enable signal, a reference clock signal, and various delayed reference clock signals, and outputs another enable signal. The control circuit receives the two enable signals and outputs and provides a control signal to a loop filter of the DLL to control a delay value associated with the DLL. The control signal is provided to the loop filter such that the delay value associated with the DLL equals a predetermined delay value for a predetermined time duration. Further, after a lapse of the predetermined time duration, the delay value associated with the DLL increases until a difference between a time period of the reference clock signal and the delay value equals a threshold value.

20 Claims, 4 Drawing Sheets

INITIALIZATION CIRCUIT OF DELAY LOCKED LOOP

BACKGROUND

The present disclosure relates generally to electronic circuits, and, more particularly, to an initialization circuit of a delay locked loop (DLL).

A DLL receives a reference clock signal and generates a delayed clock signal. The DLL typically includes a phase detector, a charge pump, a loop filter, a voltage-controlled delay line (VCDL), and an initialization circuit. The initialization circuit initializes the DLL (i.e., initializes a delay value associated with the DLL) by way of a control signal that charges the loop filter. Once the DLL is initialized, the phase detector and the charge pump can control the delay value such that the delay value is equal to a time period of the reference clock signal. The delayed clock signal is thus locked to the reference clock signal.

The initialization circuit typically generates the control signal such that the delay value is significantly less than the time period of the reference clock signal. Such a delay value can result in a timing failure in the phase detector. Further, to increase the delay value, when a voltage level of the control signal is increased, the DLL may experience harmonic locking or the DLL may fail to start. In each of these scenarios, the delayed clock signal is inaccurately locked to the reference clock signal. Further, the control signal is independent of, and hence, unable to compensate for process-voltage-temperature variations and changes in a frequency of the reference clock signal. Therefore, there exists a need for a technical solution that solves the aforementioned problems of existing initialization circuits of DLLs.

SUMMARY

In an embodiment of the present disclosure, an initialization circuit of a delay locked loop (DLL) is disclosed. The initialization circuit can include a sense circuit and a control circuit that can be coupled with the sense circuit. The sense circuit can be configured to receive a first enable signal, a reference clock signal, and a set of delayed clock signals, and output a second enable signal. The set of delayed clock signals is generated based on the reference clock signal. The control circuit can be configured to receive the first and second enable signals and provide a first control signal to a loop filter of the DLL to control a first delay value associated with the DLL. The first control signal can be provided to the loop filter such that the first delay value equals a predetermined delay value for a predetermined time duration. Further, after a lapse of the predetermined time duration, the first delay value increases until a difference between a time period of the reference clock signal and the first delay value equals a threshold value.

In another embodiment of the present disclosure, a DLL is disclosed. The DLL can include an initialization circuit and a loop filter. The initialization circuit can include a sense circuit and a control circuit that can be coupled with the sense circuit and the loop filter. The sense circuit can be configured to receive a first enable signal, a reference clock signal, and a set of delayed clock signals, and output a second enable signal. The set of delayed clock signals is generated based on the reference clock signal. The control circuit can be configured to receive the first and second enable signals and output a first control signal. The loop filter can be configured to receive the first control signal and a second control signal and output a reference voltage to control a first delay value associated with the DLL. During an initialization of the DLL, the reference voltage can be outputted based on the first control signal such that the first delay value equals a predetermined delay value for a predetermined time duration. Further, after a lapse of the predetermined time duration, the first delay value increases until a difference between a time period of the reference clock signal and the first delay value equals a threshold value. After the initialization of the DLL, the reference voltage can be outputted based on the second control signal such that the first delay value further increases until the first delay value equals the time period of the reference clock signal.

In yet another embodiment of the present disclosure, a system-on-chip (SoC) is disclosed. The SoC can include a DLL and a clock circuit that can be configured to output a reference clock signal. The DLL can include an initialization circuit and a loop filter. The initialization circuit can include a sense circuit that can be coupled with the clock circuit, and a control circuit that can be coupled with the sense circuit and the loop filter. The sense circuit can be configured to receive a first enable signal, the reference clock signal, and a set of delayed clock signals, and output a second enable signal. The set of delayed clock signals is generated based on the reference clock signal. The control circuit can be configured to receive the first and second enable signals and output a first control signal. The loop filter can be configured to receive the first control signal and a second control signal and output a reference voltage to control a first delay value associated with the DLL. During an initialization of the DLL, the reference voltage can be outputted based on the first control signal such that the first delay value equals a predetermined delay value for a predetermined time duration. Further, after a lapse of the predetermined time duration, the first delay value increases until a difference between a time period of the reference clock signal and the first delay value equals a threshold value. After the initialization of the DLL, the reference voltage can be outputted based on the second control signal such that the first delay value further increases until the first delay value equals the time period of the reference clock signal.

In some embodiments, the initialization circuit can further include a clock detection circuit that can be coupled with the control circuit and the sense circuit. The clock detection circuit can be configured to receive the reference clock signal and output and provide the first enable signal to the control circuit and the sense circuit. The first enable signal can be deactivated when the reference clock signal is received. Further, after the lapse of the predetermined time duration, the first enable signal can transition from a deactivated state to an activated state.

In some embodiments, the control circuit can include first through third resistors coupled in series with each other. The second resistor can be configured to output the first control signal. The control circuit can further include a switch that can be coupled with the second resistor and the loop filter. The switch can be configured to receive the first control signal and an inverted version of the second enable signal. The switch can be further configured to output and provide the first control signal to the loop filter when the second enable signal is deactivated.

In some embodiments, the control circuit can further include first through third transistors. The first transistor has a first terminal that can be configured to receive a supply voltage, a second terminal that can be coupled with the sense circuit, and a third terminal that can be coupled with the first resistor. The second terminal of the first transistor can be configured to receive the second enable signal from the sense circuit. The second transistor has first through third terminals. The first and third terminals of the second transistor can be coupled with the first resistor such that the second transistor is coupled in parallel with the first resistor. The second terminal of the second transistor can be coupled with the clock detection circuit. The second terminal of the second transistor can be configured to receive the first enable signal from the clock detection circuit. The third transistor has first through third terminals. The first terminal of the third transistor can be coupled with a ground terminal, the second terminal of the third transistor can be configured to receive an inverted version of the first enable signal, and the third terminal of the third transistor can be coupled with the third resistor.

In some embodiments, the control circuit can further include first and second inverters. The first inverter can be coupled with the clock detection circuit and the second terminal of the third transistor. The first inverter can be configured to receive the first enable signal from the clock detection circuit, and output and provide the inverted version of the first enable signal to the second terminal of the third transistor. The second inverter can be coupled with the sense circuit and the switch. The second inverter can be configured to receive the second enable signal from the sense circuit, and output and provide the inverted version of the second enable signal to the switch.

In some embodiments, when the first and second enable signals are deactivated, the first control signal can be outputted such that the first delay value equals the predetermined delay value. When the second enable signal is deactivated and the first enable signal is activated, the first control signal can be outputted such that the first delay value increases based on a resistor-capacitor time constant associated with the loop filter and the first and second resistors. When the difference between the time period of the reference clock signal and the first delay value equals the threshold value, the second enable signal can transition from a deactivated state to an activated state.

In some embodiments, the sense circuit can include first and second sets of flip-flops (FFs). The first set of FFs can be configured to receive the set of delayed clock signals and output a first set of FF output signals. The second set of FFs can be coupled with the first set of FFs. The second set of FFs can be configured to receive the first set of FF output signals and output a second set of FF output signals. Each FF of the first and second sets of FFs can be further coupled with the clock detection circuit. Each FF of the first and second sets of FFs can be further configured to receive the first enable signal and the reference clock signal. Based on the first enable signal and the reference clock signal, the first and second sets of FFs can further output the first and second sets of FF output signals, respectively.

In some embodiments, the sense circuit can further include a logic gate that can be coupled with the second set of FFs, and a third FF that can be coupled with the logic gate, the clock detection circuit, and the control circuit. The logic gate can be configured to receive the second set of FF output signals and output an intermediate signal. The third FF can be configured to receive the intermediate signal and the first enable signal from the logic gate and the clock detection circuit, respectively. The third FF can be further configured to receive the reference clock signal and output the second enable signal based on the reference clock signal, intermediate signal, and the first enable signal. Further, the third FF can be configured to provide the second enable signal to the control circuit.

In some embodiments, the DLL can further include a voltage-controlled delay line (VCDL) that can be coupled with the loop filter and the sense circuit. The VCDL can be configured to receive the reference clock signal and the reference voltage and generate and provide the set of delayed clock signals to the sense circuit. A delay between the reference clock signal and each delayed clock signal of the set of delayed clock signals can be greater than a half of the first delay value.

In some embodiments, the DLL can further include a VCDL that can be coupled with the loop filter. The VCDL can be configured to receive the reference clock signal and the reference voltage and generate an output clock signal such that the reference clock signal leads the output clock signal by the first delay value. The DLL can further include a lock detector that can be coupled with the VCDL. The lock detector can be configured to receive the output clock signal and the reference clock signal, and compare the output clock signal and the reference clock signal to generate a lock signal. The lock signal can be activated when the first delay value equals the time period of the reference clock signal.

In some embodiments, the DLL can further include a VCDL, a phase detector, and a charge pump. The VCDL can be coupled with the loop filter. The VCDL can be configured to receive the reference clock signal and the reference voltage and generate an output clock signal such that the reference clock signal leads the output clock signal by the first delay value. The phase detector can be coupled with the VCDL and the sense circuit. The phase detector can be configured to receive the output clock signal and the second enable signal from the VCDL and the sense circuit, respectively. Further, the phase detector can be configured to receive the reference clock signal and compare, based on the second enable signal, the output clock signal and the reference clock signal to generate first and second status signals. The charge pump can be coupled with the phase detector and the loop filter. The charge pump can be configured to receive the first and second status signals and output and provide the second control signal to the loop filter.

Various embodiments of the present disclosure disclose a DLL that can include an initialization circuit and a loop filter. The initialization circuit can include a sense circuit that can receive a first enable signal, a reference clock signal, and various delayed clock signals, and output a second enable signal. The delayed clock signals can be generated based on the reference clock signal. The initialization circuit can further include a control circuit that can output a control signal based on the two enable signals. The loop filter can receive the first control signal and a second control signal, and output a reference voltage to control a delay value associated with the DLL. During an initialization of the DLL, the reference voltage can be outputted based on the first control signal. In such a scenario, the delay value can be equal to a predetermined delay value for a predetermined time duration. Further, after a lapse of the predetermined time duration, the delay value can increase until a difference between a time period of the reference clock signal and the delay value equals a threshold value. After the initialization of the DLL, the reference voltage can be outputted based on the second control signal. In such a scenario, the delay value can further increase until the delay value equals the time period of the reference clock signal.

Thus, the initialization circuit of the present disclosure can initialize the DLL such that the delay value associated with the DLL is approximately 90% of the time period of the reference clock signal. Further, the delay value associated with the DLL is equal to the predetermined delay value for the predetermined time duration. This ensures that the DLL starts accurately (i.e., the delayed clock signals and an output clock signal are generated accurately by a VCDL of the DLL) and a phase detector of the DLL does not experience timing failure. When the delay value increases after the lapse of the predetermined time duration, the utilization of the sense circuit in the initialization circuit ensures that the delay value does not exceed the time period of the reference clock signal. The initialization circuit of the present disclosure thus avoids harmonic locking in the DLL. Further, the clock detection circuit and the sense circuit track process-voltage-temperature (PVT) variations and changes in a frequency of the reference clock signal, thereby ensuring that the first control signal is not independent of the PVT variations and the changes in the frequency of the reference clock signal. The PVT variations and the changes in the frequency of the reference clock signal can thus be compensated by way of the first control signal for achieving accurate locking between the reference clock signal and the output clock signal. Thus, the initialization circuit of the present disclosure initializes the DLL in a more accurate manner as compared to a conventional initialization circuit that initializes an associated DLL to a significantly low delay value or a significantly high delay value and is unable to track PVT variations and changes in a frequency of a reference clock signal.

BRIEF DESCRIPTION OF THE DRAWINGS

The following detailed description of the preferred embodiments of the present disclosure will be better understood when read in conjunction with the appended drawings. The present disclosure is illustrated by way of example, and not limited by the accompanying figures, in which like references indicate similar elements.

DETAILED DESCRIPTION

The detailed description of the appended drawings is intended as a description of the currently preferred embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

Figure 1:
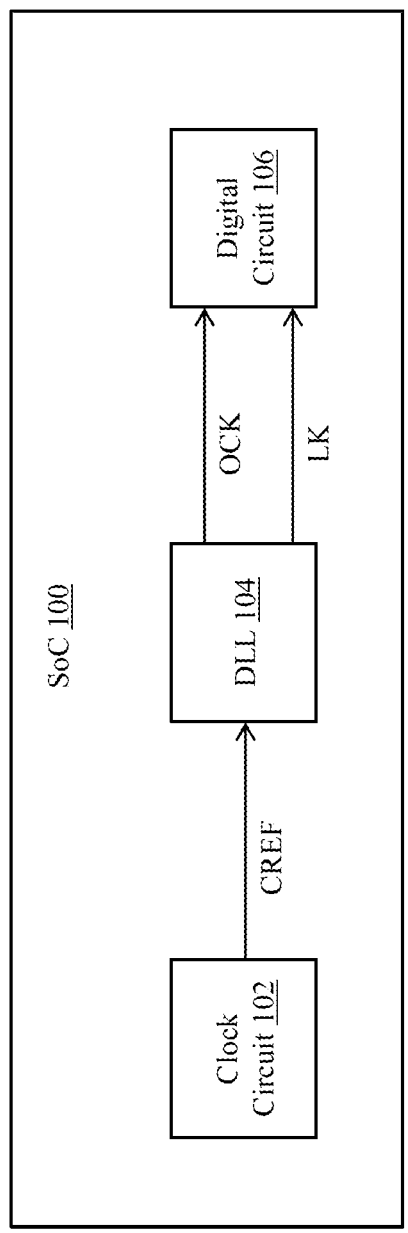
FIG. 1 illustrates a schematic block diagram of a system-on-chip (SoC) in accordance with an embodiment of the present disclosure.

FIG. 1 illustrates a schematic block diagram of a system-on-chip (SoC) 100 in accordance with an embodiment of the present disclosure. The SoC 100 can include a clock circuit 102 that can be configured to output a reference clock signal CREF. Further, the SoC 100 can include a delay locked loop (DLL) 104 and a digital circuit 106. The SoC 100 can be utilized in an automotive device, a network device, a mobile device, or the like.

The DLL 104 can be coupled with the clock circuit 102. The DLL 104 can be configured to receive the reference clock signal CREF from the clock circuit 102. Based on the reference clock signal CREF, the DLL 104 can be configured to generate an output clock signal OCK. The output clock signal OCK can be generated such that the reference clock signal CREF leads the output clock signal OCK by a first delay value associated with the DLL 104. In addition to the output clock signal OCK, the DLL 104 can be further configured to generate a lock signal LK. In an embodiment, the DLL 104 activates the lock signal LK (e.g., generates the lock signal LK at a logic high state) when the first delay value equals a time period of the reference clock signal CREF. In other words, the DLL 104 activates the lock signal LK when a delay between the reference and output clock signals CREF and OCK is equal to the time period of the reference clock signal CREF. Further, the DLL 104 deactivates the lock signal LK (e.g., generates the lock signal LK at a logic low state) when the first delay value is not equal to the time period of the reference clock signal CREF.

The digital circuit 106 can be coupled with the DLL 104. The digital circuit 106 can be configured to receive the output clock signal OCK and the lock signal LK from the DLL 104. Based on the output clock signal OCK and the lock signal LK, the digital circuit 106 can be further configured to execute one or more synchronous operations associated therewith. In an embodiment, when the lock signal LK is activated, the digital circuit 106 executes the one or more synchronous operations based on the received output clock signal OCK. Further, when the lock signal LK is deactivated, the digital circuit 106 discards the received output clock signal OCK (i.e., the received output clock signal OCK is not utilized by the digital circuit 106). Examples of the digital circuit 106 can include flip-flops, counters, or the like.

Figure 2:
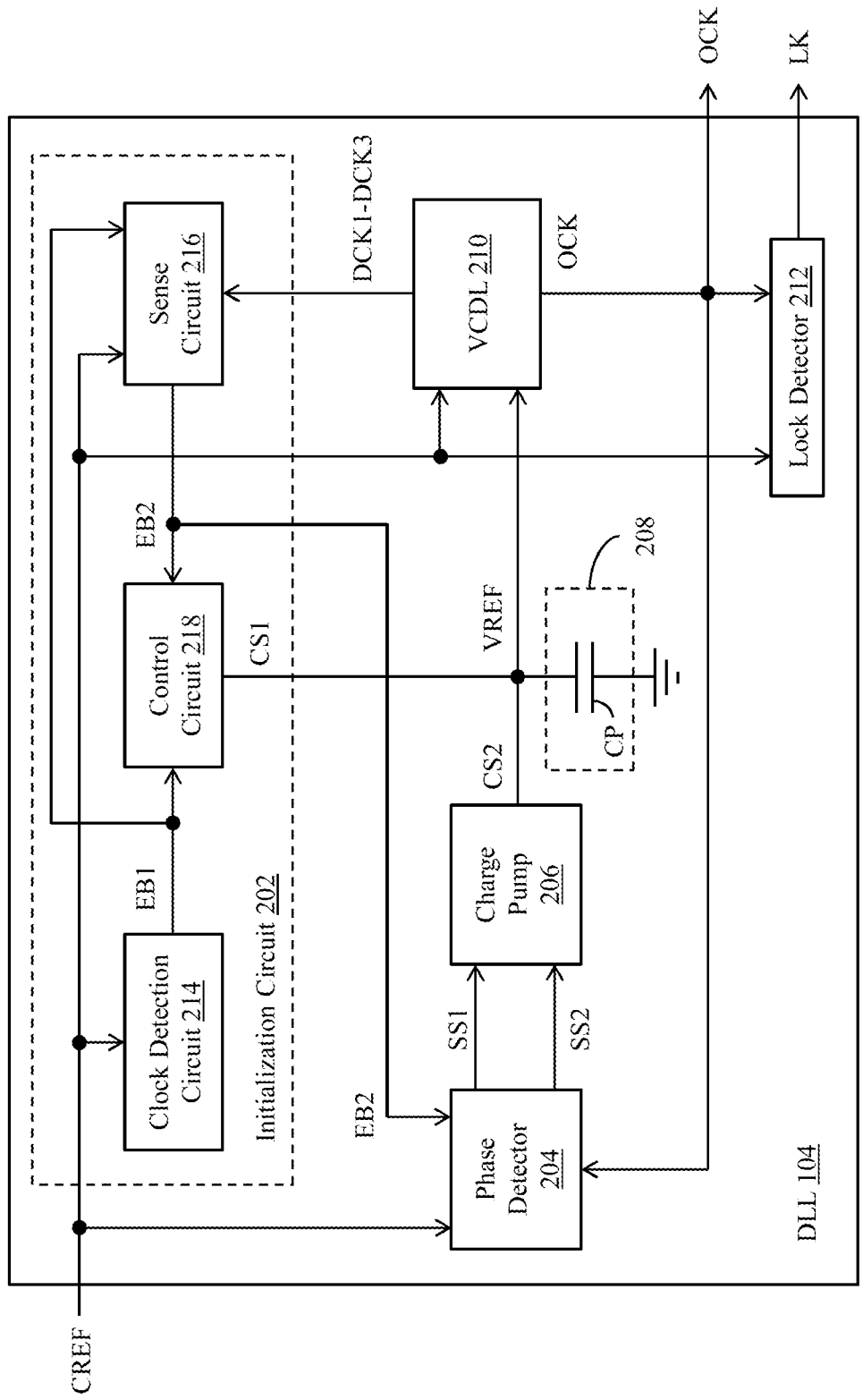
FIG. 2 illustrates a schematic block diagram of a delay locked loop (DLL) of the SoC of FIG. 1 in accordance with an embodiment of the present disclosure.

FIG. 2 illustrates a schematic block diagram of the DLL 104 in accordance with an embodiment of the present disclosure. The DLL 104 can include an initialization circuit 202, a phase detector 204, a charge pump 206, a loop filter 208, a voltage-controlled delay line (VCDL) 210, and a lock detector 212.

The initialization circuit 202 can be configured to initialize the DLL 104 such that a difference between the time period of the reference clock signal CREF and the first delay value associated with the DLL 104 equals a threshold value (not shown). In an example, the threshold value is equal to 10% of the time period of the reference clock signal CREF. Thus, if the time period of the reference clock signal CREF is equal to 10 nanoseconds, the threshold value is equal to 1 nanosecond. In other words, the initialization circuit 202 can initialize the DLL 104 such that the first delay value is equal to 9 nanoseconds (i.e., 90% of the time period of the reference clock signal CREF). The initialization circuit 202 can include a clock detection circuit 214, a sense circuit 216, and a control circuit 218.

The clock detection circuit 214 can be coupled with clock circuit 102, the sense circuit 216, and the control circuit 218. The clock detection circuit 214 can include suitable circuitry that can be configured to execute one or more operations. For example, the clock detection circuit 214 can be configured to receive the reference clock signal CREF from the clock circuit 102. Based on the reference clock signal CREF, the clock detection circuit 214 can be configured to output a first enable signal EB1. In an embodiment, the clock detection circuit 214 deactivates the first enable signal EB1 (e.g., outputs the first enable signal EB1 at a logic low state) when the reference clock signal CREF is received from the clock circuit 102. Further, after a lapse of a predetermined time duration (not shown), the first enable signal EB1 transitions from a deactivated state to an activated state. The clock detection circuit 214 can be further configured to provide the first enable signal EB1 to the control circuit 218 and the sense circuit 216. Additionally, the clock detection circuit 214 can be configured to track process-voltage-temperature (PVT) variations and changes in a frequency of the reference clock signal CREF.

The sense circuit 216 can be coupled with the clock circuit 102, the VCDL 210, the clock detection circuit 214, and the control circuit 218. The sense circuit 216 can be configured to receive the reference clock signal CREF and the first enable signal EB1 from the clock circuit 102 and the clock detection circuit 214, respectively. Further, the sense circuit 216 can be configured to receive first through third delayed clock signals DCK1-DCK3 from the VCDL 210. The first through third delayed clock signals DCK1-DCK3 can be collectively referred to as a "set of delayed clock signals DCK1-DCK3". The first through third delayed clock signals DCK1-DCK3 can be generated by the VCDL 210 based on the reference clock signal CREF. Thus, the first through third delayed clock signals DCK1-DCK3 can be also referred to as the "first through third delayed reference clock signals DCK1-DCK3".

The sense circuit 216 can be further configured to output a second enable signal EB2 based on the reference clock signal CREF, the first enable signal EB1, and the first through third delayed clock signals DCK1-DCK3. In an embodiment, the sense circuit 216 deactivates the second enable signal EB2 (e.g., outputs the second enable signal EB2 at a logic low state) when the difference between the time period of the reference clock signal CREF and the first delay value is not equal to the threshold value. Further, the sense circuit 216 activates the second enable signal EB2 (e.g., outputs the second enable signal EB2 at a logic high state) when the difference between the time period of the reference clock signal CREF and the first delay value is equal to the threshold value. Additionally, the sense circuit 216 can be configured to track the PVT variations and changes in the frequency of the reference clock signal CREF. The sense circuit 216 is explained in detail in conjunction with FIG. 3.

The control circuit 218 can be coupled with the clock detection circuit 214, the sense circuit 216, and the loop filter 208. The control circuit 218 can be configured to receive the first and second enable signals EB1 and EB2 from the clock detection circuit 214 and the sense circuit 216, respectively. Based on the first and second enable signals EB1 and EB2, the control circuit 218 can be further configured to output a first control signal CS1. The control circuit 218 can be further configured to provide the first control signal CS1 to the loop filter 208 to control the first delay value associated with the DLL 104.

The first control signal CS1 can be outputted and provided to the loop filter 208 such that the first delay value equals a predetermined delay value for the predetermined time duration. In an embodiment, the predetermined delay value is significantly less than the time period of the reference clock signal CREF. Further, the predetermined time duration corresponds to a time required by the DLL 104 to start accurately (i.e., a time required for the VCDL 210 to generate the output clock signal OCK and various delayed clock signals, such as the first through third delayed clock signals DCK1-DCK3, in an accurate manner). After the lapse of the predetermined time duration, the first control signal CS1 can be outputted and provided to the loop filter 208 such that the first delay value increases until the difference between the time period of the reference clock signal CREF and the first delay value equals the threshold value.

When the first and second enable signals EB1 and EB2 are deactivated, the first control signal CS1 can be outputted and provided to the loop filter 208 such that the first delay value equals the predetermined delay value. Further, when the second enable signal EB2 is deactivated and the first enable signal EB1 is activated, the first control signal CS1 can be outputted and provided to the loop filter 208 such that the first delay value increases based on a resistor-capacitor (RC) time constant associated with the loop filter 208 and various resistors (shown later in FIG. 4) of the control circuit 218. When the difference between the time period of the reference clock signal CREF and the first delay value equals the threshold value, the second enable signal EB2 transitions from a deactivated state to an activated state. The control circuit 218 is explained in detail in conjunction with FIG. 4.

The phase detector 204 can be coupled with the clock circuit 102, the sense circuit 216, and the VCDL 210. The phase detector 204 can include suitable circuitry that can be configured to execute one or more operations. For example, the phase detector 204 can be configured to receive the reference clock signal CREF, the second enable signal EB2, the output clock signal OCK from the clock circuit 102, the sense circuit 216, and the VCDL 210, respectively. The second enable signal EB2 controls an operation of the phase detector 204. In an embodiment, when the second enable signal EB2 is deactivated, the phase detector 204 is deactivated (i.e., the phase detector 204 is non-operational). Further, when the second enable signal EB2 is activated, the phase detector 204 is activated (i.e., the phase detector 204 is operational).

When the phase detector 204 is operational, the phase detector 204 can be configured to compare the output clock signal OCK and the reference clock signal CREF to generate first and second status signals SS1 and SS2. In an embodiment, when the reference clock signal CREF leads the output clock signal OCK, a pulse width of the first status signal SS1 is greater than a pulse width of the second status signal SS2. Further, the pulse width of the first status signal SS1 is less than the pulse width of the second status signal SS2 when the output clock signal OCK leads the reference clock signal CREF. The phase detector 204 thus compares the output clock signal OCK and the reference clock signal CREF based on the second enable signal EB2.

The charge pump 206 can be coupled with the phase detector 204 and the loop filter 208. The charge pump 206 can include suitable circuitry that can be configured to execute one or more operations. For example, the charge pump 206 can be configured to receive the first and second status signals SS1 and SS2 from the phase detector 204. Based on the first and second status signals SS1 and SS2, the charge pump 206 can be further configured to output and provide a second control signal CS2 to the loop filter 208. In an embodiment, when the pulse width of the first status signal SS1 is greater than the pulse width of the second status signal SS2, the charge pump 206 can output the second control signal CS2 such that the loop filter 208 is charged. Further, when the pulse width of the first status signal SS1 is less than the pulse width of the second status signal SS2, the charge pump 206 can output the second control signal CS2 such that the loop filter 208 is discharged.

The loop filter 208 can be coupled with the control circuit 218, the charge pump 206, and the VCDL 210. Further, the loop filter 208 can be coupled with a ground terminal. The loop filter 208 can be configured to receive the first and second control signals CS1 and CS2 from the control circuit 218 and the charge pump 206, respectively. Based on the first and second control signals CS1 and CS2, the loop filter 208 can be further configured to output a reference voltage VREF to control the first delay value associated with the DLL 104. During the initialization of the DLL 104, the reference voltage VREF can be outputted based on the first control signal CS1. In such a scenario, the first delay value can be equal to the predetermined delay value for the predetermined time duration. Further, after the lapse of the predetermined time duration, the first delay value can increase until the difference between the time period of the reference clock signal CREF and the first delay value equals the threshold value. After the initialization of the DLL 104, the reference voltage VREF can be outputted based on the second control signal CS2. In such a scenario, the first delay value can further increase until the first delay value equals the time period of the reference clock signal CREF. In an example, a voltage level of the first control signal CS1 upon the initialization of the DLL 104 is less than a voltage level of the second control signal CS2 by 50 millivolts. In the presently preferred embodiment, the loop filter 208 corresponds to a capacitor CP.

The VCDL 210 can be coupled with the clock circuit 102, the loop filter 208, the sense circuit 216, the phase detector 204, the lock detector 212, and the digital circuit 106. The VCDL 210 can be configured to receive the reference clock signal CREF and the reference voltage VREF from the clock circuit 102 and the loop filter 208, respectively. Based on the reference clock signal CREF and the reference voltage VREF, the VCDL 210 can be further configured to generate the first through third delayed clock signals DCK1-DCK3 and the output clock signal OCK. The VCDL 210 can generate the output clock signal OCK such that the reference clock signal CREF leads the output clock signal OCK by the first delay value. The VCDL 210 can be further configured to provide the first through third delayed clock signals DCK1-DCK3 to the sense circuit 216. Further, the VCDL 210 can be configured to provide the output clock signal OCK to the phase detector 204, the lock detector 212, and the digital circuit 106.

The VCDL 210 can include a plurality of delay elements (not shown) that can be coupled in series with each other. Each delay element of the plurality of delay elements has a second delay value associated therewith. In such a scenario, the first delay value associated with the DLL 104 can be equal to a sum of the second delay values associated with the plurality of delay elements. A first delay element of the plurality of delay elements can be coupled with the clock circuit 102 and the loop filter 208. The first delay element can be configured to receive the reference clock signal CREF and the reference voltage VREF from the clock circuit 102 and the loop filter 208, respectively, and output a fourth delayed clock signal (not shown). Thus, the VCDL 210 can be configured to output a plurality of delayed clock signals, with each delay element outputting one delayed clock signal. In such a scenario, if a number of delay elements in the plurality of delay elements is 'N', the first through third delayed clock signals DCK1-DCK3 can be generated by '$((N/2)+1)^{th}$', '$((N/2)+2)^{th}$', and '$((N/2)+3)^{th}$' delay elements, respectively. For example, if the VCDL 210 includes '16' delay elements, the first through third delayed clock signals DCK1-DCK3 can be generated by '$9^{th}$', '$10^{th}$', and '$11^{th}$' delay elements, respectively. Thus, a delay between the reference clock signal CREF and each delayed clock signal of the first through third delayed clock signals DCK1-DCK3 is greater than a half of the first delay value.

Further, the output clock signal OCK can be generated by a last delay element of the VCDL 210.

Although it is described that the VCDL 210 provides three delayed clock signals (i.e., the first through third delayed clock signals DCK1-DCK3) to the sense circuit 216, it will be apparent to a person skilled in the art that the scope of the present disclosure is not limited to it. In various other embodiments, the VCDL 210 can provide less than three or more than three delayed clock signals to the sense circuit 216, without deviating from the scope of the present disclosure.

The delay introduced by each delay element of the plurality of delay elements can be controlled by way of the reference voltage VREF. In an embodiment, the VCDL 210 includes a voltage-to-current converter (not shown) that receives the reference voltage VREF, and converts the reference voltage VREF to a reference current (not shown). The reference current then drives each delay element of the plurality of delay elements. In such a scenario, when the reference voltage VREF increases, the reference current decreases. The decrease in the reference current results in an increase in the second delay value associated with each delay element of the plurality of delay elements, and in turn, in an increase in the first delay value associated with the DLL 104.

The lock detector 212 can be coupled with the clock circuit 102, the VCDL 210, and the digital circuit 106. The lock detector 212 can include suitable circuitry that can be configured to execute one or more operations. For example, the lock detector 212 can be configured to receive the reference clock signal CREF and the output clock signal OCK from the clock circuit 102 and the VCDL 210, respectively. The lock detector 212 can be further configured to compare the output clock signal OCK and the reference clock signal CREF to generate the lock signal LK. In an embodiment, the lock detector 212 activates the lock signal LK when the first delay value equals the time period of the reference clock signal CREF. In other words, the lock detector 212 activates the lock signal LK when the reference clock signal CREF leads the output clock signal OCK by a value that is equal to the time period of the reference clock signal CREF. Further, the lock detector 212 deactivates the lock signal LK when the first delay value is not equal to the time period of the reference clock signal CREF. In other words, the lock detector 212 deactivates the lock signal LK when the reference clock signal CREF leads the output clock signal OCK by a value that is not equal to the time period of the reference clock signal CREF.

Figure 3:
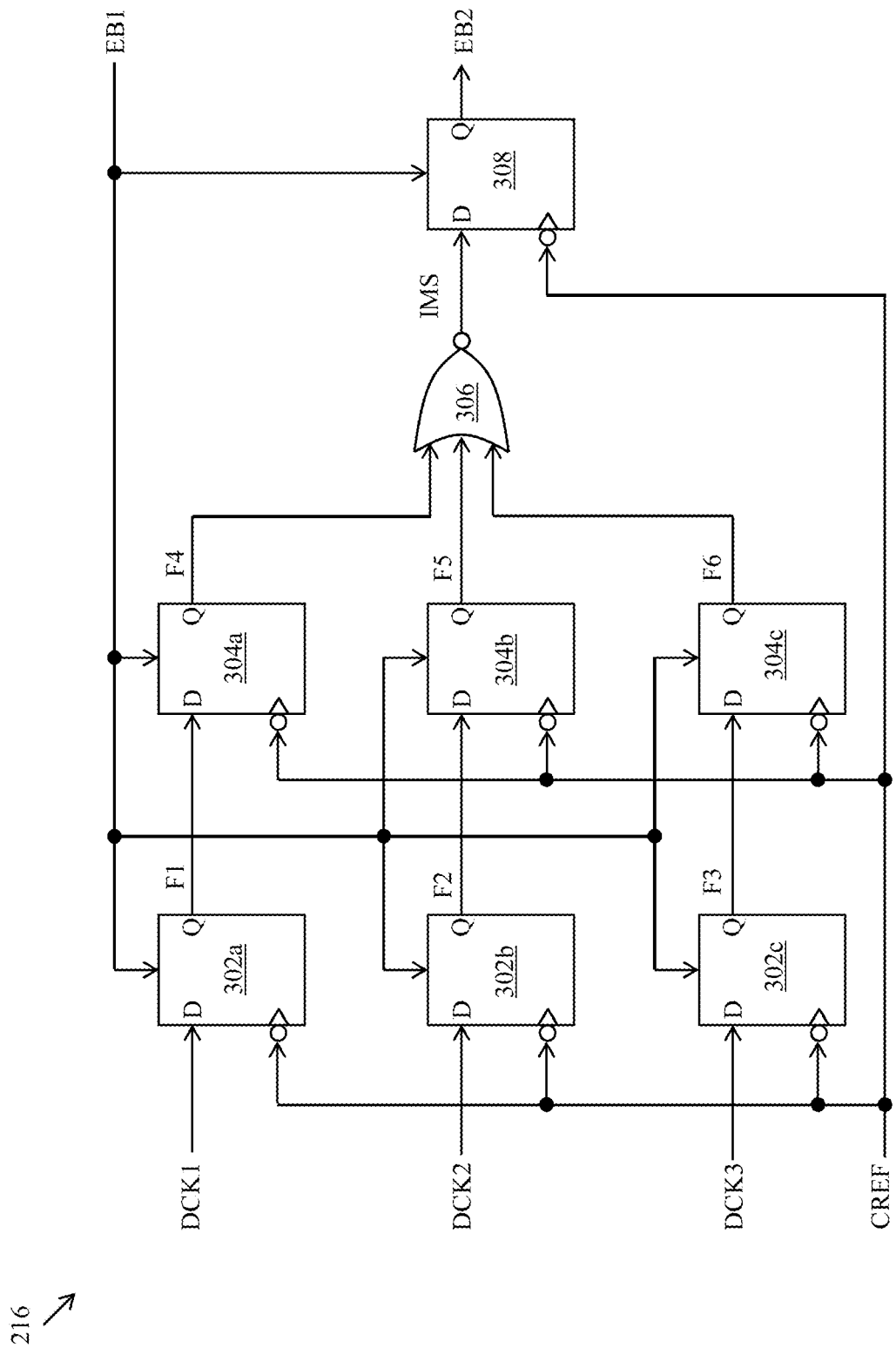
FIG. 3 illustrates a schematic circuit diagram of a sense circuit of the DLL of FIG. 2 in accordance with an embodiment of the present disclosure.

FIG. 3 illustrates a schematic circuit diagram of the sense circuit 216 in accordance with an embodiment of the present disclosure. The sense circuit 216 can include a first set of flip-flops (FFs) of which first through third FFs 302a-302c are shown, and a second set of FFs of which fourth through sixth FFs 304a-304c are shown. The sense circuit 216 can further include a logic gate 306 and a seventh FF 308.

The first FF 302a has an input terminal, a clock terminal, and a control terminal that can be coupled with the VCDL 210, the clock circuit 102, and the clock detection circuit 214, respectively. The input, clock, and control terminals of the first FF 302a can be configured to receive the first delayed clock signal DCK1, the reference clock signal CREF, and the first enable signal EB1 from the VCDL 210, the clock circuit 102, and the clock detection circuit 214, respectively. Further, the first FF 302a has an output terminal that can be configured to output a first FF output signal F1. The first FF 302a can thus output the first FF output signal F1 based on the first delayed clock signal DCK1, the reference clock signal CREF, and the first enable signal EB1. When the first enable signal EB1 is activated, the first FF 302a is operational and outputs the first FF output signal F1 at a negative edge of the reference clock signal CREF. The first FF 302a is non-operational when the first enable signal EB1 is deactivated. In an embodiment, the first FF 302a is a D FF.

The second and third FFs 302b and 302c are functionally similar to the first FF 302a. Each FF of the second and third FFs 302b and 302c has an input terminal, a clock terminal, and a control terminal that can be coupled with the VCDL 210, the clock circuit 102, and the clock detection circuit 214, respectively. The input, clock, and control terminals of the second FF 302b can be configured to receive the second delayed clock signal DCK2, the reference clock signal CREF, and the first enable signal EB1 from the VCDL 210, the clock circuit 102, and the clock detection circuit 214, respectively. Similarly, the input, clock, and control terminals of the third FF 302c can be configured to receive the third delayed clock signal DCK3, the reference clock signal CREF, and the first enable signal EB1 from the VCDL 210, the clock circuit 102, and the clock detection circuit 214, respectively. Further, each FF of the second and third FFs 302b and 302c has an output terminal. The output terminals of the second and third FFs 302b and 302c can be configured to output second and third FF output signals F2 and F3, respectively. The second FF 302b can output the second FF output signal F2 based on the second delayed clock signal DCK2, the reference clock signal CREF, and the first enable signal EB1. Similarly, the third FF 302c can output the third FF output signal F3 based on the third delayed clock signal DCK3, the reference clock signal CREF, and the first enable signal EB1. The first through third FF output signals F1-F3 are collectively referred to as a "first set of FF output signals F1-F3".

When the first enable signal EB1 is activated, the second and third FFs 302b and 302c are operational and output the second and third FF output signals F2 and F3 at the negative edge of the reference clock signal CREF, respectively. The second and third FFs 302b and 302c are non-operational when the first enable signal EB1 is deactivated. In an embodiment, each FF of the second and third FFs 302b and 302c is a D FF.

The fourth FF 304a has an input terminal, a clock terminal, and a control terminal that can be coupled with the output terminal of the first FF 302a, the clock circuit 102, and the clock detection circuit 214, respectively. The input, clock, and control terminals of the fourth FF 304a can be configured to receive the first FF output signal F1, the reference clock signal CREF, and the first enable signal EB1 from the output terminal of the first FF 302a, the clock circuit 102, and the clock detection circuit 214, respectively. Further, the fourth FF 304a has an output terminal that can be configured to output a fourth FF output signal F4. The fourth FF 304a can thus output the fourth FF output signal F4 based on the first FF output signal F1, the reference clock signal CREF, and the first enable signal EB1. When the first enable signal EB1 is activated, the fourth FF 304a is operational and outputs the fourth FF output signal F4 at the negative edge of the reference clock signal CREF. The fourth FF 304a is non-operational when the first enable signal EB1 is deactivated. In an embodiment, the fourth FF 304a is a D FF.

The fifth and sixth FFs 304b and 304c are functionally similar to the fourth FF 304a. Each FF of the fifth and sixth FFs 304b and 304c has an input terminal, a clock terminal, a control terminal, and an output terminal. The input terminals of the fifth and sixth FFs 304b and 304c can be coupled with the output terminals of the second and third FFs 302b and 302c, respectively. Further, the clock and control terminals of each FF of the fifth and sixth FFs 304b and 304c can be coupled with the clock circuit 102 and the clock detection circuit 214, respectively. The input, clock, and control terminals of the fifth FF 304b can be configured to receive the second FF output signal F2, the reference clock signal CREF, and the first enable signal EB1 from the output terminal of the second FF 302b, the clock circuit 102, and the clock detection circuit 214, respectively. Similarly, the input, clock, and control terminals of the sixth FF 304c can be configured to receive the third FF output signal F3, the reference clock signal CREF, and the first enable signal EB1 from the output terminal of the third FF 302c, the clock circuit 102, and the clock detection circuit 214, respectively. Further, the output terminals of the fifth and sixth FFs 304b and 304c can be configured to output fifth and sixth FF output signals F5 and F6, respectively. The fifth FF 304b can output the fifth FF output signal F5 based on the second FF output signal F2, the reference clock signal CREF, and the first enable signal EB1. Similarly, the sixth FF 304c can output the sixth FF output signal F6 based on the third FF output signal F3, the reference clock signal CREF, and the first enable signal EB1. The fourth through sixth FF output signals F4-F6 are collectively referred to as a "second set of FF output signals F4-F6".

When the first enable signal EB1 is activated, the fifth and sixth FFs 304b and 304c are operational and output the fifth and sixth FF output signals F5 and F6 at the negative edge of the reference clock signal CREF, respectively. The fifth and sixth FFs 304b and 304c are non-operational when the first enable signal EB1 is deactivated. In an embodiment, each of the fifth and sixth FFs 304b and 304c is a D FF.

Although FIG. 3 illustrates that each of the first and second sets of FFs includes three FFs, it will be apparent to a person skilled in the art that the scope of the present disclosure is not limited to it. In various other embodiments, each of the first and second sets of FFs can include less than three FFs or more than three FFs, without deviating from the scope of the present disclosure.

The logic gate 306 has first through third input terminals that can be coupled with the output terminals of the fourth through sixth FFs 304a-304c, respectively. The first through third input terminals of the logic gate 306 can be configured to receive the fourth through sixth FF output signals F4-F6 from the output terminals of the fourth through sixth FFs 304a-304c, respectively. The logic gate 306 further has an output terminal that can be configured to output an intermediate signal IMS based on the fourth through sixth FF output signals F4-F6. In an embodiment, the intermediate signal IMS is deactivated (e.g., is at a logic low state) when at least one of the fourth through sixth FF output signals F4-F6 is activated. Further, the intermediate signal IMS is activated (e.g., is at a logic high state) when the fourth through sixth FF output signals F4-F6 are deactivated. In an embodiment, the logic gate 306 is a NOR gate.

The seventh FF 308 has an input terminal, a clock terminal, and a control terminal that can be coupled with the output terminal of the logic gate 306, the clock circuit 102, and the clock detection circuit 214, respectively. The input, clock, and control terminals of the seventh FF 308 can be configured to receive the intermediate signal IMS, the reference clock signal CREF, and the first enable signal EB1 from the output terminal of the logic gate 306, the clock circuit 102, and the clock detection circuit 214, respectively. Further, the seventh FF 308 has an output terminal that can be configured to output the second enable signal EB2. The seventh FF 308 can thus output the second enable signal EB2 based on the intermediate signal IMS, the reference clock signal CREF, and the first enable signal EB1. When the first enable signal EB1 is activated, the seventh FF 308 is operational and outputs the second enable signal EB2 at the negative edge of the reference clock signal CREF. The seventh FF 308 is non-operational when the first enable signal EB1 is deactivated. The output terminal of the seventh FF 308 can be further coupled with the control circuit 218 and the phase detector 204. The output terminal of the seventh FF 308 can be further configured to provide the second enable signal EB2 to the control circuit 218 and the phase detector 204.

When the DLL 104 receives the reference clock signal CREF, the first enable signal EB1 is deactivated, thereby deactivating the sense circuit 216. After the lapse of the predetermined time duration, the first enable signal EB1 transitions from a deactivated state to an activated state. As a result, the first through seventh FFs 302a-302c, 304a-304c, and 308 are activated. In such a scenario, as the first delay value is equal to the predetermined delay value during the predetermined time duration, the first through third delayed clock signals DCK1-DCK3 are activated at the negative edge of the reference clock signal CREF. Hence, the first through third FF output signals F1-F3 are activated, and consequently, the second enable signal EB2 is deactivated.

As the first delay value increases, the delay between the reference clock signal CREF and each of the first through third delayed clock signals DCK1-DCK3 increases. When the first delay value equals an intermediate value (not shown), the third delayed clock signal DCK3 can be generated such that the third delayed clock signal DCK3 is deactivated at the negative edge of the reference clock signal CREF. A further increase in the first delay value can result in the second and first delayed clock signals DCK2 and DCK1 being deactivated at the negative edge of the reference clock signal CREF. When each of the first through third delayed clock signals DCK1-DCK3 is deactivated at the negative edge of the reference clock signal CREF, the first through third FF output signals F1-F3 are deactivated, and consequently, the second enable signal EB2 is activated. The deactivation of each of the first through third delayed clock signals DCK1-DCK3 at the negative edge of the reference clock signal CREF indicates that the difference between the time period of the reference clock signal CREF and the first delay value is equal to the threshold value. Thus, the second enable signal EB2 transitions from a deactivated state to an activated state when the difference between the time period of the reference clock signal CREF and the first delay value is equal to the threshold value.

Figure 4:
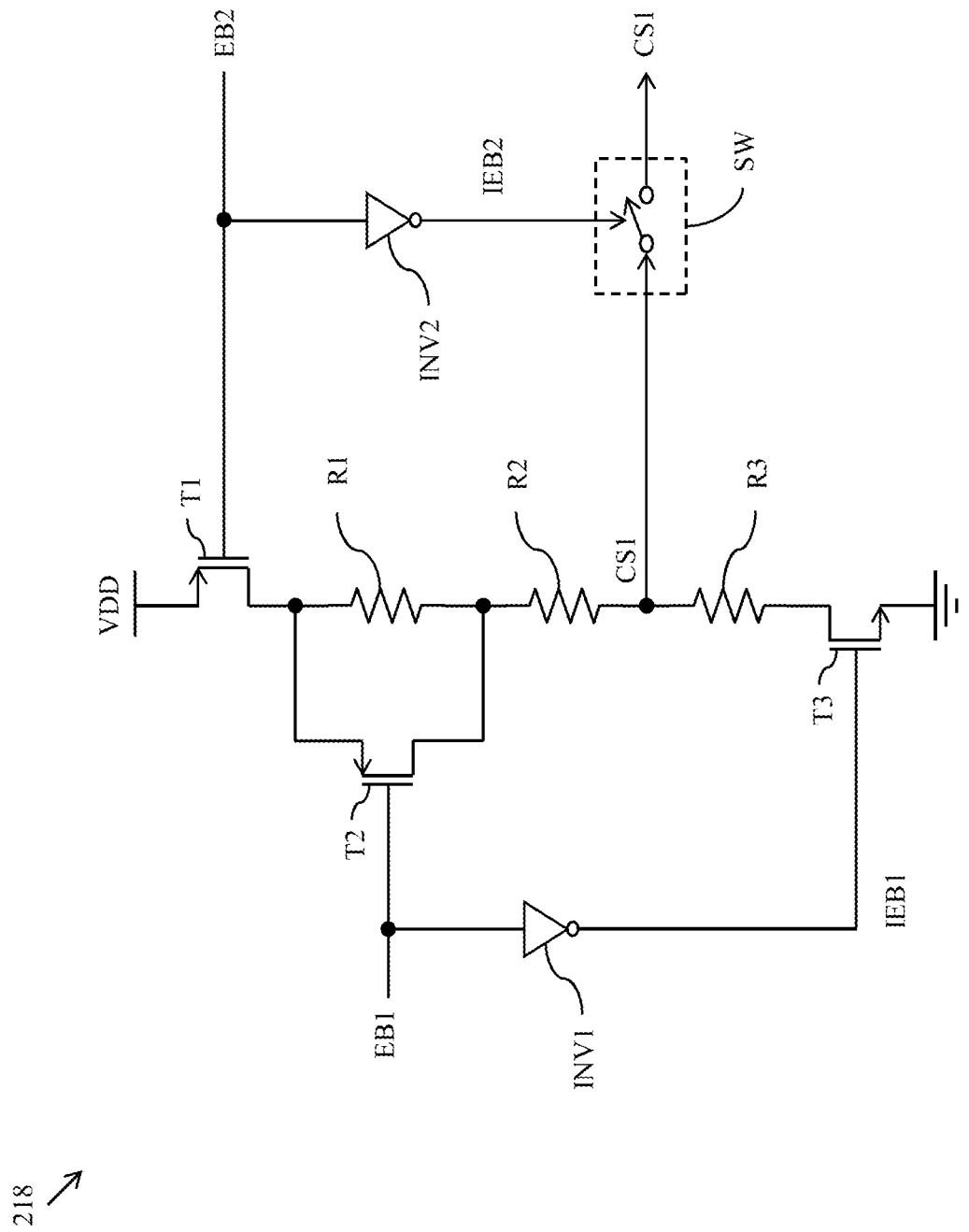
FIG. 4 illustrates a schematic circuit diagram of a control circuit of the DLL of FIG. 2 in accordance with an embodiment of the present disclosure.

FIG. 4 illustrates a schematic circuit diagram of the control circuit 218 in accordance with an embodiment of the present disclosure. The control circuit 218 can include first through third resistors R1-R3 each having first and second terminals, first through third transistors T1-T3 each having first through third terminals, first and second inverters INV1 and INV2, and a switch SW.

The first through third terminals of the first transistor T1 can be coupled with a power supply (not shown), the sense circuit 216 (i.e., the output terminal of the seventh FF 308), and the first terminal of the first resistor R1, respectively. The first and second terminals of the first transistor T1 can be configured to receive a supply voltage VDD and the second enable signal EB2 from the power supply and the sense circuit 216 (i.e., the output terminal of the seventh FF 308), respectively. In an embodiment, the first transistor T1 corresponds to a p-channel metal oxide semiconductor (PMOS) transistor, and the first through third terminals of the first transistor T1 corresponds to source, gate, and drain terminals, respectively. The second terminal of the first resistor R1 can be coupled with the first terminal of the second resistor R2.

The first and third terminals of the second transistor T2 can be coupled with the first and second terminals of the first resistor R1, respectively. In other words, the second transistor T2 can be coupled in parallel with the first resistor R1. The second terminal of the second transistor T2 can be coupled with the clock detection circuit 214. The second terminal of the second transistor T2 can be configured to receive the first enable signal EB1 from the clock detection circuit 214. In an embodiment, the second transistor T2 corresponds to a PMOS transistor, and the first through third terminals of the second transistor T2 corresponds to source, gate, and drain terminals, respectively.

The second terminal of the second resistor R2 can be coupled with the first terminal of the third resistor R3. In other words, the first through third resistors R1-R3 can be coupled in series with each other. Further, the second terminal of the second resistor R2 can be configured to output the first control signal CS1. The first terminal of the third transistor T3 can be coupled with the ground terminal, and the second terminal of the third transistor T3 can be configured to receive an inverted version of the first enable signal EB1 (hereinafter referred to as an "inverted first enable signal IEB1"). Further, the third terminal of the third transistor T3 can be coupled with the second terminal of the third resistor R3. In an embodiment, the third transistor T3 corresponds to an n-channel metal oxide semiconductor (NMOS) transistor, and the first through third terminals of the third transistor T3 corresponds to source, gate, and drain terminals, respectively.

The switch SW can be coupled with the second terminal of the second resistor R2 and the loop filter 208. The switch SW can be configured to receive the first control signal CS1 from the second terminal of the second resistor R2. Further, the switch SW can be configured to receive an inverted version of the second enable signal EB2 (hereinafter referred to as an "inverted second enable signal IEB2"). Based on the inverted second enable signal IEB2, the switch SW can be further configured to output and provide the first control signal CS1 to the loop filter 208. In an embodiment, the switch SW is activated and deactivated when the second enable signal EB2 is deactivated and activated, respectively. Thus, the switch SW can output and provide the first control signal CS1 to the loop filter 208 when the second enable signal EB2 is deactivated.

The first inverter INV1 can be coupled with the clock detection circuit 214 and the second terminal of the third transistor T3. The first inverter INV1 can be configured to receive the first enable signal EB1 from the clock detection circuit 214. Further, the first inverter INV1 can be configured to output and provide the inverted first enable signal IEB1 to the second terminal of the third transistor T3. The second inverter INV2 can be coupled with the sense circuit 216 (i.e., the output terminal of the seventh FF 308) and the switch SW. The second inverter INV2 can be configured to receive the second enable signal EB2 from the sense circuit 216 (i.e., the output terminal of the seventh FF 308). Further, the second inverter INV2 can be configured to output and provide the inverted second enable signal IEB2 to the switch SW.

When the reference clock signal CREF is received by the DLL 104, the first and second enable signals EB1 and EB2 are deactivated. Hence, the first through third transistors T1-T3 are activated. As the second transistor T2 is activated, the first resistor R1 is bypassed. The second and third resistors R2 and R3 thus form a voltage divider. Further, as the second enable signal EB2 is deactivated, the switch SW is activated, and the first control signal CS1 is provided to the loop filter 208 to charge the loop filter 208. In such a scenario, the first control signal CS1 is outputted such that the first delay value equals the predetermined delay value.

After the lapse of the predetermined time duration, the first enable signal EB1 is activated. As a result, the second and third transistors T2 and T3 are deactivated. At such a time instance, each of the first through third delayed clock signals DCK1-DCK3 is activated at the negative edge of the reference clock signal CREF. Hence, the second enable signal EB2 remains deactivated. Consequently, the first transistor T1 and the switch SW remain activated. In such a scenario, the loop filter 208 is charged by way of the first and second resistors R1 and R2. Hence, when the second enable signal EB2 is deactivated and the first enable signal EB1 is activated, the first control signal CS1 is outputted such that the first delay value increases based on the RC time constant associated with the loop filter 208 and the first and second resistors R1 and R2. A resistance value of the first resistor R1 is significant (e.g., 10 mega-ohms). Thus, when the first enable signal EB1 is activated and the second enable signal EB2 is deactivated, the loop filter 208 is charged gradually (i.e., the first delay value increases gradually).

As the first delay value increases, the delay between the reference clock signal CREF and each of the first through third delayed clock signals DCK1-DCK3 increases. When each of the first through third delayed clock signals DCK1-DCK3 is deactivated at the negative edge of the reference clock signal CREF, the difference between the time period of the reference clock signal CREF and the first delay value is equal to the threshold value. In such a scenario, the second enable signal EB2 transitions from a deactivated state to an activated state. The transition of the second enable signal EB2 from a deactivated state to an activated state indicates that the DLL 104 is initialized to a desired value. When the second enable signal EB2 is activated, the first transistor T1 and the switch SW are deactivated. In other words, the control circuit 218 is deactivated. Further, when the second enable signal EB2 is activated, the phase detector 204 is operational. The phase detector 204 and the charge pump 206 can then control the first delay value by way of the second control signal CS2 such that the first delay value is equal to the time period of the reference clock signal CREF.

Thus, the initialization circuit 202 of the present disclosure can initialize the DLL 104 such that the first delay value associated with the DLL 104 is approximately equal to 90% of the time period of the reference clock signal CREF. As the first delay value is equal to the predetermined delay value for the predetermined time duration, the DLL 104 starts accurately (i.e., the VCDL 210 accurately generates the output clock signal OCK and all intermediate delayed clock signals, e.g., the first through third delayed clock signals DCK1-DCK3). Further, the equality of the first delay value and the predetermined delay value for the predetermined time duration ensures that the phase detector 204 does not experience timing failure (i.e., the phase detector 204 can accurately compare the output and reference clock signals OCK and CREF). When the first delay value increases after the lapse of the predetermined time duration, the utilization of the sense circuit 216 in the initialization circuit 202 ensures that the first delay value does not exceed the time period of the reference clock signal CREF. The initialization circuit 202 thus avoids harmonic locking in the DLL 104. Further, the clock detection circuit 214 and the sense circuit 216 track the PVT variations and changes in the frequency of the reference clock signal CREF, thereby ensuring that the first control signal CS1 is not independent of the PVT variations and the changes in the frequency of the reference clock signal CREF. The PVT variations and the changes in the frequency of the reference clock signal CREF can thus be compensated by way of the first control signal CS1. Hence, the initialization circuit 202 of the present disclosure initializes the DLL 104 in a more accurate manner as compared to a conventional initialization circuit. The conventional initialization circuit corresponds to an initialization circuit that initializes an associated DLL to a significantly low delay value or a significantly high delay value, and that is unable to track PVT variations and changes in a frequency of an associated reference clock signal.

While various embodiments of the present disclosure have been illustrated and described, it will be clear that the present disclosure is not limited to these embodiments only. Numerous modifications, changes, variations, substitutions, and equivalents will be apparent to those skilled in the art, without departing from the spirit and scope of the present disclosure, as described in the claims. Further, unless stated otherwise, terms such as "first" and "second" are used to arbitrarily distinguish between the elements such terms describe. Thus, these terms are not necessarily intended to indicate temporal or other prioritization of such elements.

The invention claimed is:

1. An initialization circuit of a delay locked loop (DLL), the initialization circuit comprising:
    a sense circuit configured to receive a first enable signal, a reference clock signal, and a set of delayed clock signals that is generated based on the reference clock signal, and output a second enable signal; and
    a control circuit that is coupled with the sense circuit, and configured to receive the first and second enable signals and provide a first control signal to a loop filter of the DLL to control a first delay value associated with the DLL, wherein the first delay value equals a predetermined delay value for a predetermined time duration, and after a lapse of the predetermined time duration, the first delay value increases until a difference between a time period of the reference clock signal and the first delay value equals a threshold value.

2. The initialization circuit of claim 1, further comprising a clock detection circuit that is coupled with the control circuit and the sense circuit, and configured to receive the reference clock signal and output and provide the first enable signal to the control circuit and the sense circuit, wherein the first enable signal is deactivated when the reference clock signal is received, and wherein after the lapse of the predetermined time duration, the first enable signal transitions from a deactivated state to an activated state.

3. The initialization circuit of claim 2, wherein the control circuit comprises:
    first through third resistors coupled in series with each other, wherein the second resistor is configured to output the first control signal; and
    a switch that is coupled with the second resistor and the loop filter, and configured to receive the first control signal and an inverted version of the second enable signal, and output and provide the first control signal to the loop filter when the second enable signal is deactivated.

4. The initialization circuit of claim 3, wherein the control circuit further comprises:
- a first transistor that has (i) a first terminal configured to receive a supply voltage, (ii) a second terminal coupled with the sense circuit, and configured to receive the second enable signal, and (iii) a third terminal coupled with the first resistor;
- a second transistor that has first through third terminals, wherein the first and third terminals of the second transistor are coupled with the first resistor such that the second transistor is coupled in parallel with the first resistor, and wherein the second terminal of the second transistor is coupled with the clock detection circuit, and configured to receive the first enable signal; and
- a third transistor that has (i) a first terminal coupled with a ground terminal, (ii) a second terminal configured to receive an inverted version of the first enable signal, and (iii) a third terminal coupled with the third resistor.

5. The initialization circuit of claim 4, wherein the control circuit further comprises:
- a first inverter that is coupled with the clock detection circuit and the second terminal of the third transistor, and configured to receive the first enable signal and output and provide the inverted version of the first enable signal to the second terminal of the third transistor; and
- a second inverter that is coupled with the sense circuit and the switch, and configured to receive the second enable signal and output and provide the inverted version of the second enable signal to the switch.

6. The initialization circuit of claim 4, wherein when the first and second enable signals are deactivated, the first control signal is outputted such that the first delay value equals the predetermined delay value, wherein when the second enable signal is deactivated and the first enable signal is activated, the first control signal is outputted such that the first delay value increases based on a resistor-capacitor time constant associated with the loop filter and the first and second resistors, and wherein when the difference between the time period of the reference clock signal and the first delay value equals the threshold value, the second enable signal transitions from a deactivated state to an activated state.

7. The initialization circuit of claim 2, wherein the sense circuit comprises:
- a first set of flip-flops (FFs) configured to receive the set of delayed clock signals and output a first set of FF output signals; and
- a second set of FFs that is coupled with the first set of FFs, and configured to receive the first set of FF output signals and output a second set of FF output signals, wherein each FF of the first and second sets of FFs is further coupled with the clock detection circuit, and configured to receive the first enable signal and the reference clock signal, and wherein the first and second sets of FFs further output the first and second sets of FF output signals, respectively, based on the first enable signal and the reference clock signal.

8. The initialization circuit of claim 7, wherein the sense circuit further comprises:
- a logic gate that is coupled with the second set of FFs, and configured to receive the second set of FF output signals, and output an intermediate signal; and
- a third FF that is coupled with the logic gate and the clock detection circuit, and configured to receive the intermediate signal and the first enable signal, respectively, wherein the third FF is further configured to receive the reference clock signal, and output the second enable signal based on the reference clock signal, the intermediate signal, and the first enable signal, and wherein the third FF is further coupled with the control circuit, and configured to provide the second enable signal to the control circuit.

9. The initialization circuit of claim 1, wherein a delay between the reference clock signal and each delayed clock signal of the set of delayed clock signals is greater than a half of the first delay value.

10. A delay locked loop (DLL), comprising:
an initialization circuit comprising:
- a sense circuit configured to receive a first enable signal, a reference clock signal, and a set of delayed clock signals that is generated based on the reference clock signal, and output a second enable signal; and
- a control circuit coupled with the sense circuit, and configured to receive the first and second enable signals and output a first control signal; and a loop filter that is coupled with the control circuit, and configured to receive the first control signal and a second control signal and output a reference voltage to control a first delay value associated with the DLL, wherein during an initialization of the DLL, the reference voltage is outputted based on the first control signal such that the first delay value equals a predetermined delay value for a predetermined time duration, and after a lapse of the predetermined time duration, the first delay value increases until a difference between a time period of the reference clock signal and the first delay value equals a threshold value, and wherein after the initialization of the DLL, the reference voltage is outputted based on the second control signal such that the first delay value further increases until the first delay value equals the time period of the reference clock signal.

11. The DLL of claim 10, wherein the initialization circuit further comprises a clock detection circuit that is coupled with the control circuit and the sense circuit, and configured to receive the reference clock signal, and output and provide the first enable signal to the control circuit and the sense circuit, wherein the first enable signal is deactivated when the reference clock signal is received, and wherein after the lapse of the predetermined time duration, the first enable signal transitions from a deactivated state to an activated state.

12. The DLL of claim 11, wherein the control circuit comprises:
- first through third resistors coupled in series with each other, wherein the second resistor is configured to output the first control signal; and
- a switch that is coupled with the second resistor and the loop filter, and configured to receive the first control signal and an inverted version of the second enable signal, and output and provide the first control signal to the loop filter when the second enable signal is deactivated.

13. The DLL of claim 12, wherein the control circuit further comprises:
- a first transistor that has (i) a first terminal configured to receive a supply voltage, (ii) a second terminal coupled with the sense circuit, and configured to receive the second enable signal, and (iii) a third terminal coupled with the first resistor;
- a second transistor that has first through third terminals, wherein the first and third terminals of the second transistor are coupled with the first resistor such that the second transistor is coupled in parallel with the first resistor, and wherein the second terminal of the second transistor is coupled with the clock detection circuit, and configured to receive the first enable signal; and a third transistor that has (i) a first terminal coupled with a ground terminal, (ii) a second terminal configured to receive an inverted version of the first enable signal, and (iii) a third terminal coupled with the third resistor.

14. The DLL of claim 13, wherein when the first and second enable signals are deactivated, the first control signal is outputted such that first delay value equals the predetermined delay value, wherein when the second enable signal is deactivated and the first enable signal is activated, the first control signal is outputted such that the first delay value increases based on a resistor-capacitor time constant associated with the loop filter and the first and second resistors, and wherein when the difference between the time period of the reference clock signal and the first delay value equals the threshold value, the second enable signal transitions from a deactivated state to an activated state.

15. The DLL of claim 11, wherein the sense circuit comprises:

a first set of flip-flops (FFs) configured to receive the set of delayed clock signals and output a first set of FF output signals; and a second set of FFs that is coupled with the first set of FFs, and configured to receive the first set of FF output signals and output a second set of FF output signals, wherein each FF of the first and second sets of FFs is further coupled with the clock detection circuit, and configured to receive the first enable signal and the reference clock signal, and wherein the first and second sets of FFs further output the first and second sets of FF output signals, respectively, based on the first enable signal and the reference clock signal.

16. The DLL of claim 15, wherein the sense circuit further comprises:

a logic gate that is coupled with the second set of FFs, and configured to receive the second set of FF output signals and output an intermediate signal; and a third FF that is coupled with the logic gate and the clock detection circuit, and configured to receive the intermediate signal and the first enable signal, respectively, wherein the third FF is further configured to receive the reference clock signal and output the second enable signal based on the reference clock signal, the intermediate signal, and the first enable signal, and wherein the third FF is further coupled with the control circuit, and configured to provide the second enable signal to the control circuit.

17. The DLL of claim 10, further comprising a voltage-controlled delay line (VCDL) that is coupled with the loop filter and the sense circuit, and configured to receive the reference clock signal and the reference voltage, and generate and provide the set of delayed clock signals to the sense circuit, wherein a delay between the reference clock signal and each delayed clock signal of the set of delayed clock signals is greater than a half of the first delay value.

18. The DLL of claim 10, further comprising:

a VCDL that is coupled with the loop filter, and configured to receive the reference clock signal and the reference voltage, and generate an output clock signal such that the reference clock signal leads the output clock signal by the first delay value; and a lock detector that is coupled with the VCDL, and configured to receive the output clock signal and the reference clock signal, and compare the output clock signal and the reference clock signal to generate a lock signal, wherein the lock signal is activated when the first delay value equals the time period of the reference clock signal.

19. The DLL of claim 10, further comprising:

a VCDL that is coupled with the loop filter, and configured to receive the reference clock signal and the reference voltage and generate an output clock signal such that the reference clock signal leads the output clock signal by the first delay value;

a phase detector that is coupled with the VCDL and the sense circuit, and configured to receive the output clock signal and the second enable signal, wherein the phase detector is further configured to receive the reference clock signal, and compare, based on the second enable signal, the output clock signal and the reference clock signal to generate first and second status signals; and a charge pump that is coupled with the phase detector and the loop filter, and configured to receive the first and second status signals and output and provide the second control signal to the loop filter.

20. A system-on-chip, comprising:

a clock circuit configured to output a reference clock signal; and a delay locked loop (DLL), comprising:

an initialization circuit comprising:

a sense circuit coupled with the clock circuit, and configured to receive a first enable signal, the reference clock signal, and a set of delayed clock signals that is generated based on the reference clock signal, and output a second enable signal; and a control circuit coupled with the sense circuit, and configured to receive the first and second enable signals and output a first control signal; and a loop filter that is coupled with the control circuit, and configured to receive the first control signal and a second control signal and output a reference voltage to control a first delay value associated with the DLL, wherein during an initialization of the DLL, the reference voltage is outputted based on the first control signal such that the first delay value equals a predetermined delay value for a predetermined time duration, and after a lapse of the predetermined time duration, the first delay value increases until a difference between a time period of the reference clock signal and the first delay value equals a threshold value, and wherein after the initialization of the DLL, the reference voltage is outputted based on the second control signal such that the first delay value further increases until the first delay value equals the time period of the reference clock signal.

* * * * *